United States Patent [19]
Nishikawa et al.

[11] Patent Number: 5,516,031
[45] Date of Patent: May 14, 1996

[54] SOLDERING METHOD AND APPARATUS FOR USE IN CONNECTING ELECTRONIC CIRCUIT DEVICES

[75] Inventors: Toru Nishikawa, Yokohama; Masahito Ijuin, Fujisawa; Ryohei Sato, Yokohama; Mitsugu Shirai, Hadano, all of Japan

[73] Assignee: Hitachi, Ltd., Tokyo, Japan

[21] Appl. No.: 235,909

[22] Filed: May 2, 1994

Related U.S. Application Data

[63] Continuation-in-part of Ser. No. 890,255, May 29, 1992, Pat. No. 5,341,980, which is a continuation-in-part of Ser. No. 656,465, Feb. 19, 1991, abandoned.

[30] Foreign Application Priority Data

May 18, 1993 [JP] Japan .................................. 5-115916

[51] Int. Cl.⁶ ............................ B23K 1/20; B23K 3/08
[52] U.S. Cl. .......................... 228/205; 228/102; 228/9; 228/42
[58] Field of Search ........................... 228/102, 124.1, 228/180, 22, 205, 9, 19, 42

[56] References Cited

U.S. PATENT DOCUMENTS

| | | | |
|---|---|---|---|
| 4,379,218 | 4/1983 | Grebe et al. | 228/205 |
| 5,188,280 | 2/1993 | Nakao et al. | 228/205 |
| 5,226,580 | 7/1993 | Hartle et al. | 228/205 |

*Primary Examiner*—Samuel M. Heinrich
*Attorney, Agent, or Firm*—Antonelli, Terry, Stout & Kraus

[57] ABSTRACT

In order to remove oxide film and contamination film on members to be bonded by soldering and solder material therefor corresponding to variation of thickness thereof by sputter-etching in a fluxless bonding method and apparatus therefor, substance emitted from the solder material under sputter-etching using atom or ion is detected and determined whether it is from the solder material or from the oxide film thereon. The sputter-etching is controlled on the basis of the determination to remove the oxide film. Then, the members are aligned in oxidizing atmosphere and soldered in non-oxidizing atmosphere.

27 Claims, 11 Drawing Sheets

100
SPUTTER-CLEANING DEVICE

200
BELT FURNACE

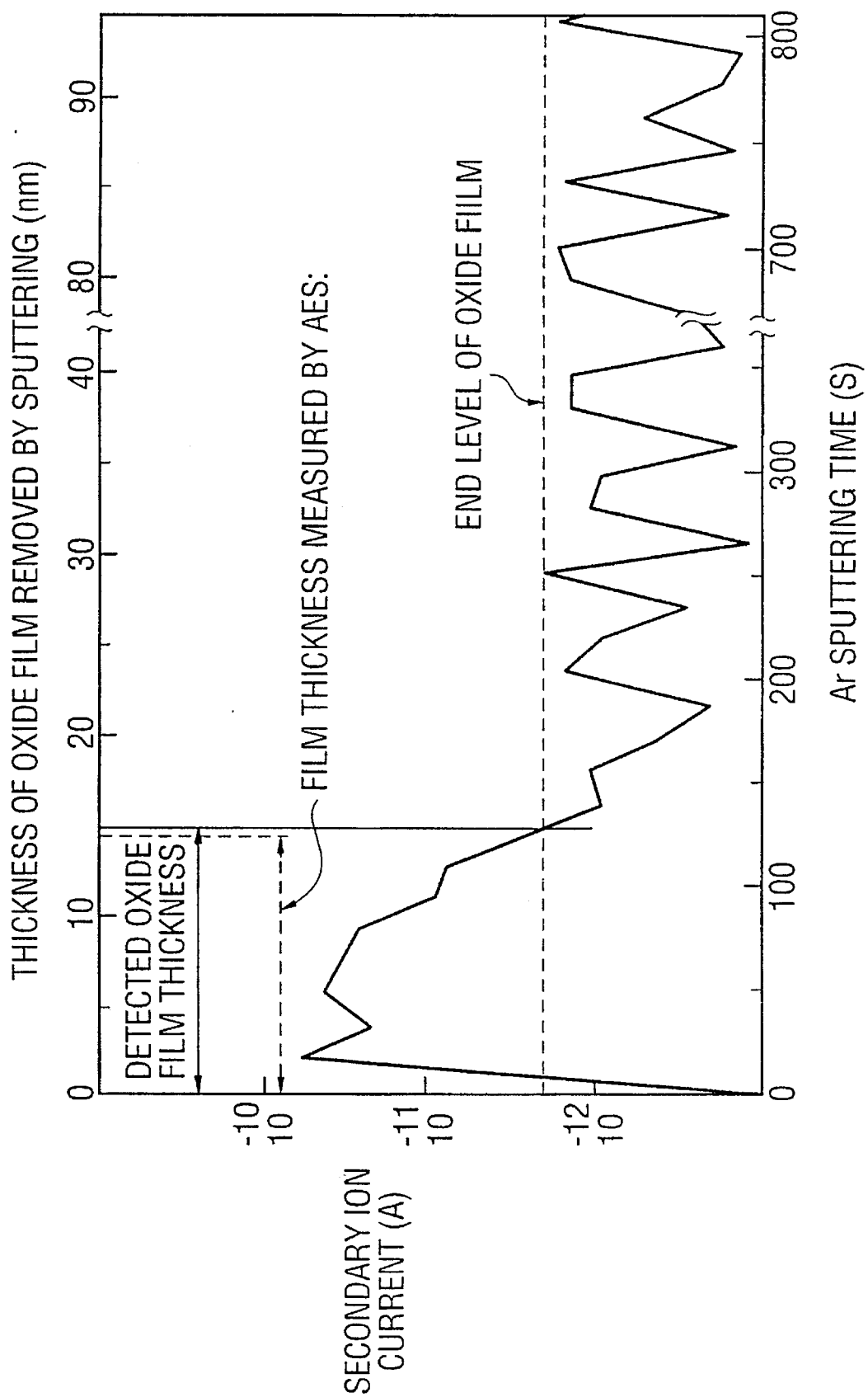

ROUND-RECESS TYPE SOLDER POSITIONING PLATE

SOLDER BALL SUPPLY AND OXIDE FILM REMOVAL BY Ar SPUTTERING

SOLDER SUPPLY TO PRINTED CIRCUIT BOARD

SOLDERING METHOD AND APPARATUS FOR USE IN CONNECTING ELECTRONIC CIRCUIT DEVICES

BACKGROUND OF THE INVENTION

This application is a Continuation-in-Part application of application Ser. No. 890,255, filed on May 29, 1992, now U.S. Pat. No. 5,341,980, which is a Continuation-in-Part application of application Ser. No. 656,465, filed on Feb. 19, 1991, now abandoned.

The present invention relates to a method and an apparatus for fabricating an electronic circuit device and particularly, to a fluxless soldering method and apparatus for soldering at least two different materials or members of such circuit devices.

When two different materials or members are to be soldered together, it is usual to use flux or cream solder or solder paste containing flux to remove oxide films formed on surfaces of such members, maintain these surfaces clean by preventing oxidation thereof and promote wettability of solder on these surfaces. However, when such flux or flux-containing cream solder is used, there is a tendency of void generation due to evaporation of flux in soldering operation, which causes strength and hence reliability of soldered junction to be lowered.

Further, in such conventional technique, there is an environmental pollution problem, particularly, such as destruction of ozone layer, due to removal of flux since flux must be washed out by using organic solvent such as chloric solvent or freon after the soldering is completed. Further, it is very difficult to completely wash out flux although not impossible.

In order to solve such problem, various soldering methods requiring no flux have been proposed. For example, Japanese Patent Application Laid-open (Kokai) Nos. S58-3238 and H3-171643 disclose methods each of which comprises the steps of setting a member carrying solder bumps or solder balls and a member having bonding pads or bonding faces, removing oxide films and/or contamination on surfaces of the solder balls and the pads by irradiating them with ion beam, aligning these members and bonding them by heating and melting the solder balls, all of these steps being performed in vacuum. In another example disclosed in Japanese Patent Application Laid-open (Kokai) No. H3-241755, contamination layers and oxide layers on surfaces of members to be bonded together and solder balls are removed by sputter-etching with atom or ion. Then, these members are aligned in an oxidizing atmosphere and solder bumps are melted by heating to achieve the bonding.

In these conventional methods, since the sputter-etching step is performed while estimating time necessary to remove oxide film on solder balls, it is impossible to remove the oxide films on the surfaces of the solder balls correspondingly to actual thickness thereof. Further, in the former two methods in which all of the steps are performed in vacuum, the workability and producibility are low and, when a device for alignment is provided in a vacuum chamber, the size of the latter becomes large necessarily, in which case, the vacuum chamber tends to be contaminated since gas adsorbed in an inner wall of the vacuum chamber is hardly discharged externally, and an apparatus itself for performing the same method becomes high cost.

SUMMARY OF THE INVENTION

An object of the present invention is to provide a method of soldering members without using flux and an apparatus for performing the same method.

Another object of the present invention is to provide such fluxless soldering method in which an alignment of members can be performed in atmospheric, oxidizing atmosphere and an apparatus for performing the same method.

A further object of the present invention is to provide, a fluxless soldering method, a method and apparatus for removing oxide film on solder balls by sputter-etching according to thickness of oxide film thereon.

In order to achieve the above mentioned objects, according to the present invention, the soldering methods comprises the steps of:

detecting at least one substance emitted from the solder balls by atom or ion sputter-etching, determining whether the detected substance is from oxide layer on a surface of the solder ball or from the solder ball itself and removing the oxide film on the solder ball by controlling the sputter-etching according to a result of determination;

aligning members to be soldered in an oxidizing atmosphere; and heating the members in non-oxidizing atmosphere.

Further, in the above mentioned objects, the apparatus according to the present invention comprises:

means for removing oxide film on a soldering ball by detecting at least one substances emitted from the solder ball by atom or ion sputter-etching, determining whether or not the detected substance is from the oxide layer on a surface of the solder ball or from the solder ball itself and controlling the sputter-etching according to a result of determination;

means for aligning members to be soldered in an oxidizing atmosphere; and heating means for heating solder balls on the members in non-oxidizing atmosphere.

BRIEF DESCRIPTION OF THE DRAWINGS

FIG. 7 is a graph showing thickness of oxide film on a surface of solder ball monitored according to the present invention;

DETAILED DESCRIPTION OF THE PREFERRED EMBODIMENTS

Figure 1:
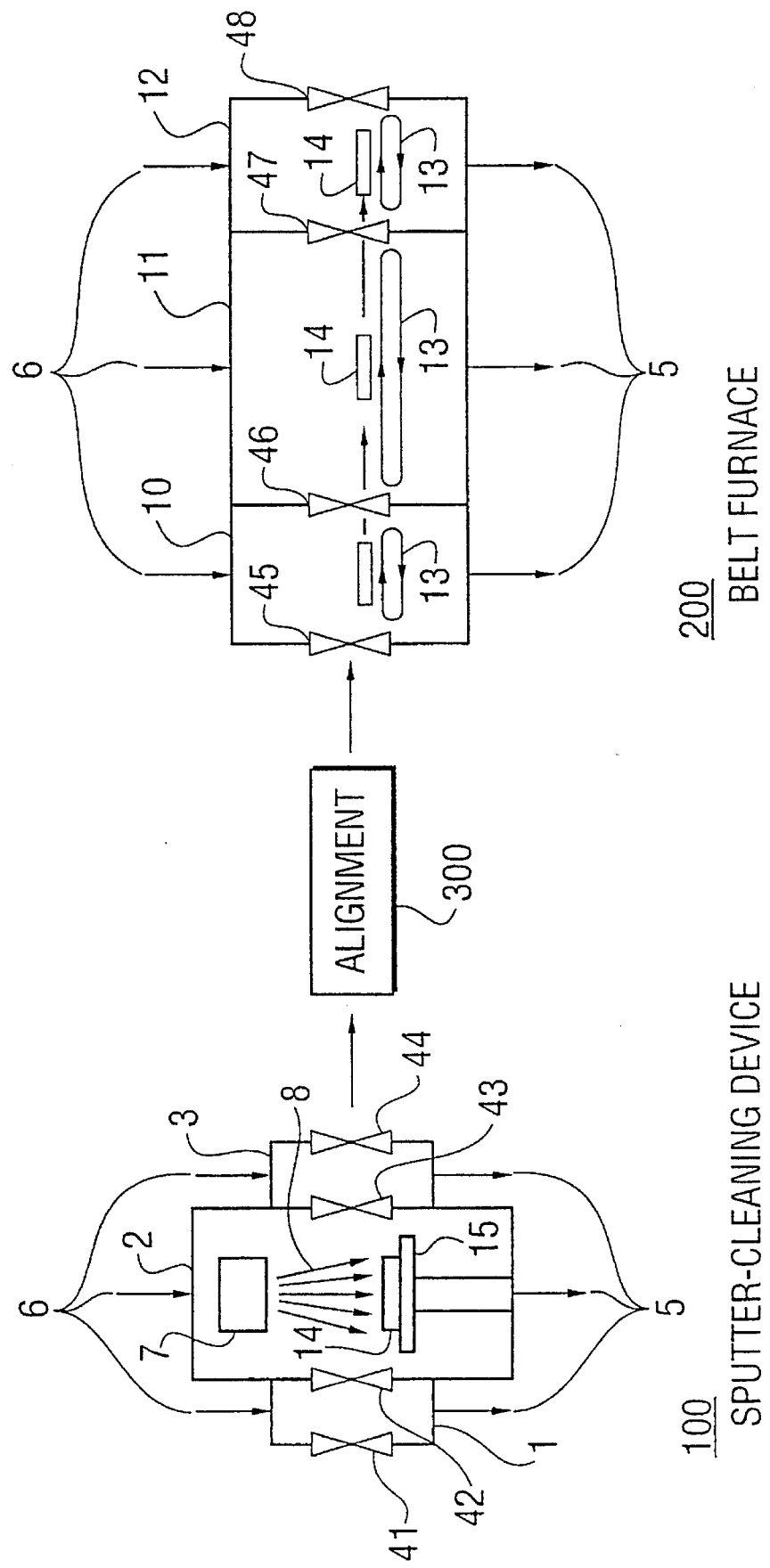
FIG. 1 is a block diagram showing a construction of a soldering apparatus for soldering electronic circuits, according to the present invention.

The inventors of this invention had studied a fluxless soldering method and apparatus in view point of removal of oxide film on a solder ball by means of sputter-etching according to variation of thickness thereof.

In the conventional methods disclosed in the previously mentioned Kokai Nos. S58-3238, H3-171643 and H3-241755, the sputter-etching for removing oxide film on the solder ball is terminated when a previously estimated removing time lapses regardless of unavoidable variation in thickness of the oxide film. In such method, the following defects may occur:

(a) There may be residual oxide film on the solder ball which is left unetched. In such case, breakage of oxide film which will be newly formed hardly occurs when solder ball is expanded by heat applied for melting it. Even if it is broken, such residual oxide film will prevent the solder from wetting. Further, there may be fault connection since a formation of bonding configuration of soldering material to be achieved by surface tension of molten soldering material, such as meniscus of filet, spherical segment in flip-chip connection and self-alignment, is disturbed by surface oxide film; and (b) When a portion of soldering material is lost by over sputter-etching, similar fault of connection to that mentioned in (a) may occur. It has been found that this phenomenon occurs due to the facts that, since there is difference in etching rate between a plurality of intermetallic compounds co-existing in the soldering material, surface of the soldering material becomes irregular and surface area of the soldering material becomes large and tends to be oxidized and that, since an amount of soldering material structure around the intermetallic compounds having low etching rate is reduced, melting rate of these compounds is lowered and hence melting of surface portion thereof is insufficient, rigidity of soldering material is increased and hence fluidity thereof is reduced. That is, according to the method in which oxide film removing time is preliminarily estimated and, when the estimated time lapses, the sputter-etching is terminated, as in the previously mentioned conventional techniques, it is impossible to remove oxide film on a surface of a soldering material correspondingly to thickness variation of oxide film.

From the result of analysis mentioned above, the inventors of this invention have concluded that, if it is possible to determine whether sputter-etching is currently performed for oxide film and/or contamination on surface of a soldering material or the soldering material itself and if it is possible to stop sputter-etching at a suitable time instance, there is no residual oxide film left unetched due to under-etching or there is no loss of soldering material due to over-etching, so that oxide film on the surface of the soldering material can be removed according to thickness variation of the oxide film on the soldering material.

It has been known that material is etched away by bombardment of atom or ion having kinetic energy directed thereto and that, due to such bombardment of atom or ion, substance such as secondary atom, secondary ion, photon (characteristic X ray) or secondary electron, which is specific to the material, are emitted therefrom. Since the amount of substance is specific to individual materials, it is possible to control the sputter-etching by detecting an amount of emitted substance and determining whether the detected substance is from oxide film on the soldering material or from constituents of the soldering material. Phenomenon of emission of such as secondary atom, secondary ion, photon (characteristic x ray), secondary electron by sputter-etching will be described in detail. In sputter-etching, when atom of a solid material is bombarded with incident particle having energy, the atom is energized thereby and emitted as secondary atom or secondary ion. For atom which constitute a solid material which is not sputter-etched, it becomes excited state by energy of incident particle. In the latter case, the atom tends to return from the unstable excited state to a stable ground state by emitting photon (characteristic X ray) or secondary electron.

The bonding method according to the present invention will be described in detail.

The soldering methods comprises the steps of:

detecting at least one substance emitted from the solder ball by atom or ion sputter-etching, determining whether the detected substance is from oxide layer on a surface of the solder ball or from the solder ball itself and removing the oxide film on the solder ball by controlling the sputter-etching according to a result of determination;

aligning members to be soldered in an oxidizing atmosphere; and heating the members in non-oxidizing atmosphere.

The substance emitted from material in the present invention may be any so long it is substance specific to the material. Examples of such substance include secondary atom, secondary ion, photon (characteristic X ray) or secondary electron.

The detection of substance in the present method is performed for at least one of secondary atom, secondary ion, photon (characteristic X ray) and secondary electron.

The soldering material used in the present method may be any soldering material. Examples of such soldering material include alloys of Pb and Sn, alloys of Sn and Ag, alloys of Au and Sn, alloys of Au and Ge, alloys of Au and Si and any combination thereof.

The non-oxidizing atmosphere in the present method may be any non-oxidizing atmosphere. Examples thereof include inert gas, reducing gas, fluorinate vapor or active gas atmosphere. Inert gas includes nitrogen gas, argon gas, helium gas and active gas may be selected from (1) mixture of hydrogen gas and nitrogen gas and (2) hydrogen gas.

Further, the soldering apparatus for use in connecting electronic circuits, according to the present invention comprises:

means for removing oxide film on a solder ball by detecting at least one substance emitted from the solder balls by atom or ion sputter-etching, determining whether or not the detected substance is from oxide layer on a surface of the solder ball or from the solder ball itself and controlling the sputter-etching according to a result of determination;

means for aligning members to be soldered in an oxidizing atmosphere; and heating means for heating solder balls on the members in non-oxidizing atmosphere.

The removing means includes means for detecting at least one substance emitted specifically from the solder balls by atom or ion sputter-etching, such as at least one of secondary atom, secondary ion, photon (characteristic X ray) and secondary electron, and can remove reliably and in proper quantity the oxide film on the surface of the solder ball by controlling the sputter-etching. The aligning means performs an alignment in oxidizing atmosphere, so that an apparatus and process therefor can be simplified. The heating means includes evacuation means and means for supplying non-oxidizing gas, for controlling purity of heating gas, that is, impurity gas concentration of the heating gas. The heating means further includes a plenum chamber, a heating and melting chamber and a cooling chamber which are partitioned by partition walls and selectively in communication with each other by gate valves provided in the partition walls. With such construction, gas and/or water content, etc., adsorbed by members to be bonded together is removed in the plenum chamber, so that degradation of purity of atmospheric gas in the heating and melting chamber can be prevented.

Substance emitted, detection of the substance, soldering material and non-oxidizing atmosphere to be used in the soldering apparatus are the same as those described with respect to the soldering method according to the present invention.

Preferred embodiments of the present invention will be described in detail with reference to the drawings.

FIG. 1 shows a construction of a fluxless soldering apparatus according to an embodiment of the present invention. In FIG. 1, a sputter-cleaning device 100 includes a plenum chamber 1, a cleaning chamber 2 and an outlet chamber 3, all of which are evacuated and adjacent ones of which can be selectively communicated through gate valves 42 and 43, respectively. Further, a gate valve 41 is provided in an inlet of the plenum chamber 1 and a gate valve 44 is provided in an outlet of the outlet chamber 3.

Each chamber is associated with an evacuating system 5 and a gas introducing system 6 and, in both the plenum chamber 1 and the outlet chamber 3, gas purge is performed by evacuation and subsequent communication to atmosphere.

In the cleaning chamber 2, evacuation and gas supply to a gun 7 provided therein to emit ion and/or atom are performed.

Solder portions, that is, solder balls or solder bumps, and connecting pads, etc., of a member 14 transported into the sputter-cleaning device 100 and put on a sample table 15, which are to be bonded together, are irradiated with ion or atom beam 8 to remove oxide films and/or organic contamination films.

The cleaning chamber 2 can treat a plurality of mutually connected connecting members simultaneously.

The member 14 thus cleaned is transported to the alignment mechanism 300 and, after alignment, transported to the belt furnace 200.

The transportation of the member 14 from the sputter cleaning device 100 through the alignment mechanism 300 to the belt furnace 200 is continuously performed by means of belt conveyors.

The belt furnace 200 comprises a plenum chamber 10, a heating and welding chamber 11 and a cooling chamber 12, all of which can be evacuated and between adjacent ones of which are connected by gate valves 46 and 47. Further, a gate valve 45 is provided in an inlet of the plenum chamber 10 and a gate valve 48 is provided in an outlet of the cooling chamber 12.

Each chamber is associated with an evacuating system 5 and a gas introducing system 6 and, in both the plenum chamber 1 and the outlet chamber 3, gas purge is performed by evacuation and subsequent introduction of non-oxidizing gas.

The member 14 in the belt furnace 200 is transported through the respective chambers 10, 11 and 12 by belt conveyors 13 provided therein, respectively.

Figure 2:
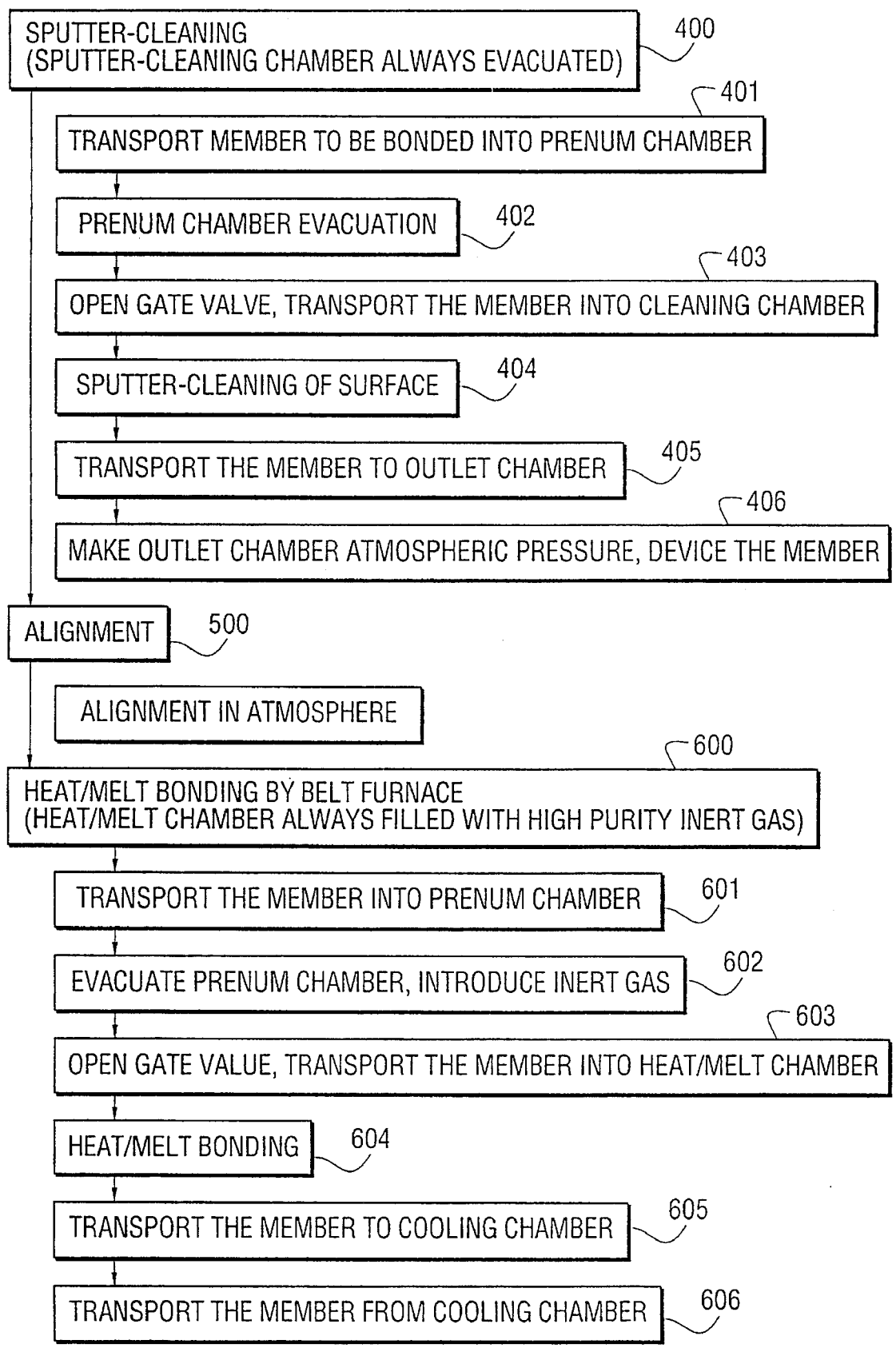
FIG. 2 is a flowchart showing a fluxless soldering method according to the present invention.

FIG. 2 shows a flowchart of a fluxless soldering operation by means of the apparatus shown in FIG. 1. In an initial stage, all of the gate valves 41 to 48 are closed.

In a step 400 in FIG. 2, oxide film and/or organic contaminating film on bonding pads of the member 14 and on the solder portions is removed by the sputter-cleaning device 100. The step 400 includes steps 401 to 406. The cleaning chamber 2 is continuously evacuated so that vacuum pressure of $10^{-5}$ Torr or higher is maintained therein.

In the step 401, the gate valve 41 of the inlet of the plenum chamber 1 of the sputter cleaning device 100 is opened to convey the member 14 having solder bumps at predetermined positions thereof into the plenum chamber 1. In the step 402, the plenum chamber 1 is evacuated. When an amount of gas and/or water content adsorbed by the member 14 such as printed circuit board, etc., is much, heating is performed additionally simultaneously with the evacuation of the plenum chamber 1, to thereby prevent vacuum condition in the subsequent cleaning chamber 2 from being degraded. It may be possible to reduce a processing time in the cleaning chamber 2 by providing a baking device in a preceding position with respect to the plenum chamber 1. The baking device may perform evacuation and heating.

Then, in the step 403, the gate valve 42 between the plenum chamber 1 and the cleaning chamber 2 is opened through which the member 14 is transported into the cleaning chamber 2. Thereafter, the gate valve 42 is closed. Then, in the step 404, the member 14 in the cleaning chamber 2 is irradiated with ion or atom beam 8 from the gun 7 while being rotated to remove undesired films on the solder balls and the connecting pads to sputter-clean surfaces thereof.

In the step 405, the outlet side gate valve 43 of the cleaning chamber 2 is opened and the thus cleaned member 14 is transported into the outlet chamber 3 maintained at vacuum pressure and then the latter gate valve 43 is closed.

Thereafter, in the step 406, the outlet chamber 3 is made atmospheric pressure and its outlet side gate valve 44 is opened through which the member 14 is derived therefrom.

Then, in a step 500, an alignment between two members 14 thus processed is performed by means of the alignment mechanism 300 in atmospheric environment.

Then, in a step 600, the fluxless soldering is performed by the belt furnace 200. The step 600 includes steps 601 to 606. It should be noted that the interior of the heating and welding chamber 11 is continuously filled with highly pure non-oxidizing atmosphere by evacuation and subsequent introduction of non-oxidizing gas.

In the step 601, the inlet side gate valve 45 of the plenum chamber 10 is opened through which the aligned members 14 are introduced thereinto. In the step 602, the plenum chamber 10 is evacuated and then filled with highly pure non-oxidizing gas.

Then, in the step 603, the gate valve 46 between the plenum chamber 10 and the heating and soldering chamber 11 is opened to move the members 14 to the latter and, in the step 604, the gate valve 46 is closed and heating of the bonding portions of the members 14 is performed.

Thereafter, in the step 605, the gate valve 47 between the heating and melting chamber 11 and the cooling chamber 12 is opened, through which the soldered members 14 are transported to the cooling chamber 12 which is filled with highly pure inert gas. After cooling, in the step 606, the cooling chamber 12 is made atmospheric pressure and then the bonded members 14 are derived therefrom through the gate valve 48 opened at that time.

Since concentration of impurity gas in the highly pure inert gas atmosphere can be selected arbitrarily on the basis of vacuum pressure to be established therein and purity of the inert gas to be introduced thereinto, it is possible to set an optimum fluxless bonding condition for any of combinations of various soldering material and members to be bonded.

When a solder material containing, for example, Sn which exhibits superior wettability is used, it is possible to perform a fluxless soldering by removing the plenum chamber 10 and the cooling chamber 12 and filling the heating and welding chamber 11 with inert gas such as nitrogen gas, argon gas or helium gas.

Further, it is possible to further reduce concentration of residual oxygen by introducing hydrogen gas into the inert gas to allow reaction between hydrogen gas thus introduced and residual oxygen to occur.

Alternatively, it may be possible to remove the evacuation systems of the belt furnace and, instead thereof, use a belt furnace in which atmospheric gas therein is substituted by such inert gas.

FIG. 3 illustrates the process of melting and soldering of the solder ball in the present invention.

Figure 3A:
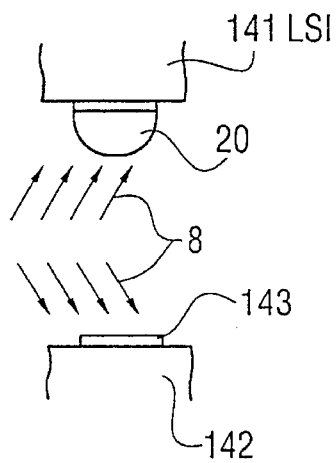
FIG. 3 illustrates soldering steps of a fluxless soldering method according to the present invention.

As shown in FIG. 3(a), oxide films and contamination layers on a plurality of solder balls 20 (only one of them is shown) on an LSI 141 and a bonding pad 143 on a ceramic substrate 142 are removed first by irradiating them with particle beam 8 of such as Ar atom in the sputter-cleaning device 100.

Figure 3B:
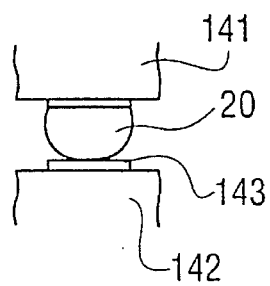
Figure 3C:
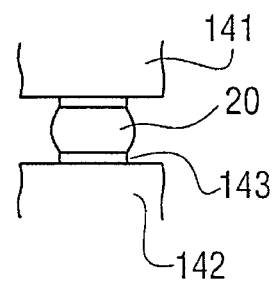
Figure 3D:
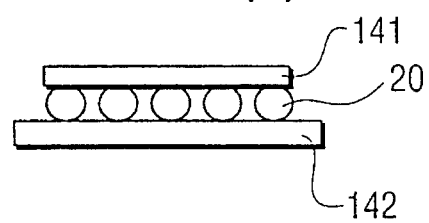

Then, after the solder ball 20 and the bonding pad 143 are aligned with each other in atmosphere as shown in FIG. 3(b), they are heated in the belt furnace 200 so that they are melt-bonded as shown in FIG. 3(c). Thus, the LSI 141 and the ceramic substrate 142 are bonded together through a plurality of the solder balls 20 as shown in FIG. 3(d).

Any of usually used soldering materials such as Pb5Sn, Sn3.5Ag, Sn37Pb, Au12Ge, etc., can be used as the material of the solder ball 20 and the belt furnace 200 may be filled with an inert gas of a mixture of hydrogen gas and nitrogen gas in a ratio of 1:1 or 1:3. The ratio of hydrogen gas and nitrogen gas can be set suitably according to the soldering condition.

The solder ball 20 is formed on the LSI 141 through a similar process to that mentioned above.

Figure 4:
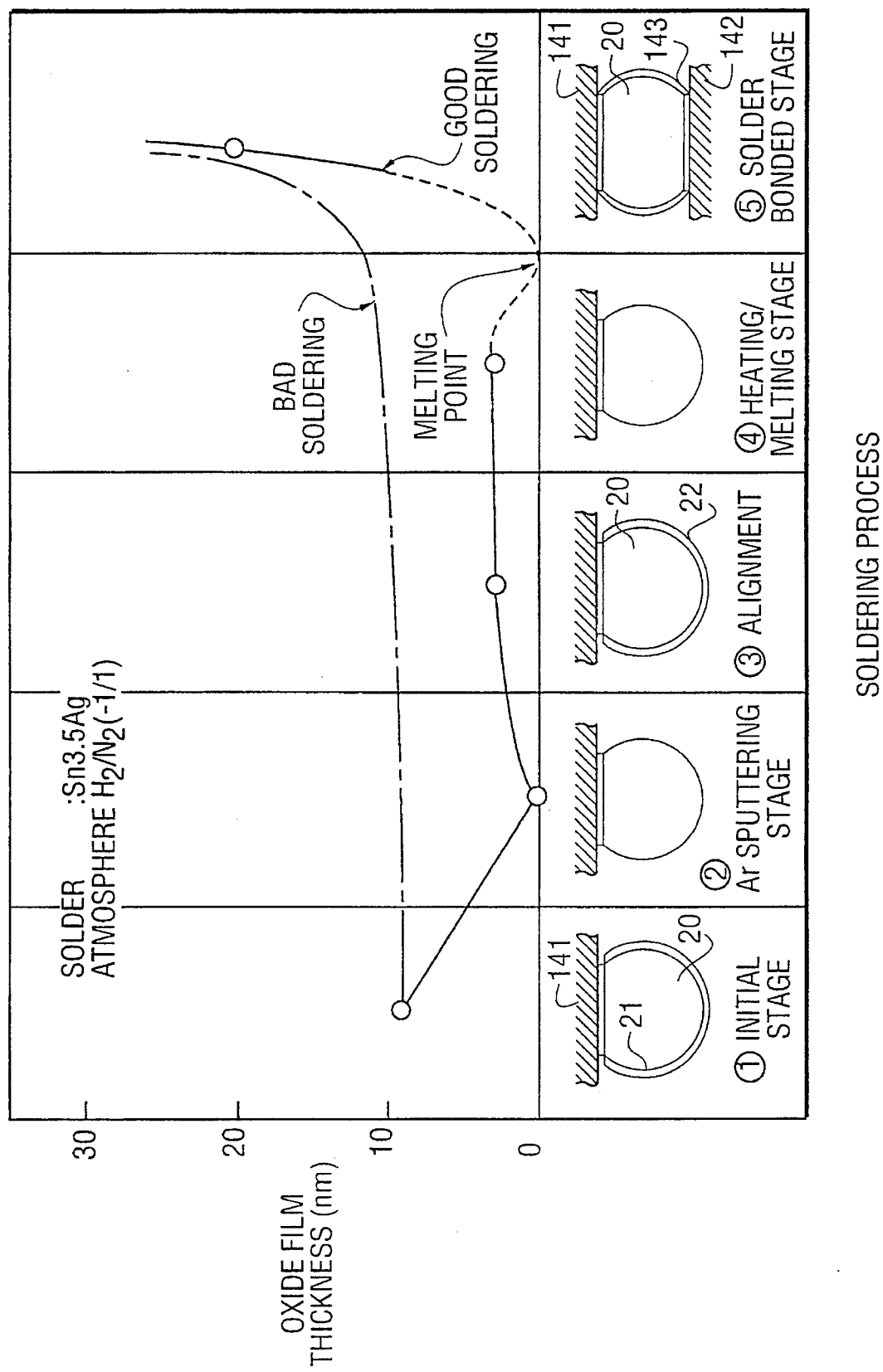
FIG. 4 is a graph showing thickness of oxide film on a solder ball formed by the soldering apparatus of the present invention, in comparison with that formed by a conventional apparatus.

A solid line in FIG. 4 shows data of an example of change of thickness of oxide film on the solder ball 20 in the above mentioned process.

In an initial stage (1) in FIG. 4, the solder ball 20 is covered by a thick oxide and/or contamination film 21.

In a next stage (2), the thick oxide and/or contamination film 21 is removed by the sputter-cleaning and the initial oxide film thickness of about 10 nm is reduced to almost zero.

In a stage (3), an oxide film 22 is formed again on the surface of the solder ball 20 due to the alignment in atmosphere. Since, in this stage, the solder ball 20 is not heated, growing rate of the oxide film 22 is low and thickness thereof is restricted to 2–3 nm or thinner.

When the sample in the stage (3) is heated in the belt furnace 200, the solder ball 20 is melted and expanded and the oxide film 22 thereon is fractured thereby to expose the solder ball as shown in a stage (4) in FIG. 4.

In a stage (5), the LSI 141 and the ceramic substrate 142 are bonded together by the solder ball melted in the stage (4). Due to the heating of the solder ball to melt it, a relatively thick oxide film is formed on a surface of the solder ball after solidified.

A chain line in FIG. 4 shows a characteristics of the solder ball when the sputter-cleaning process is not performed therefor. Since, in such case, the initial thick oxide film is left as it is, fault connection occurs frequently in the melting process in the stage (4).

Figure 5:
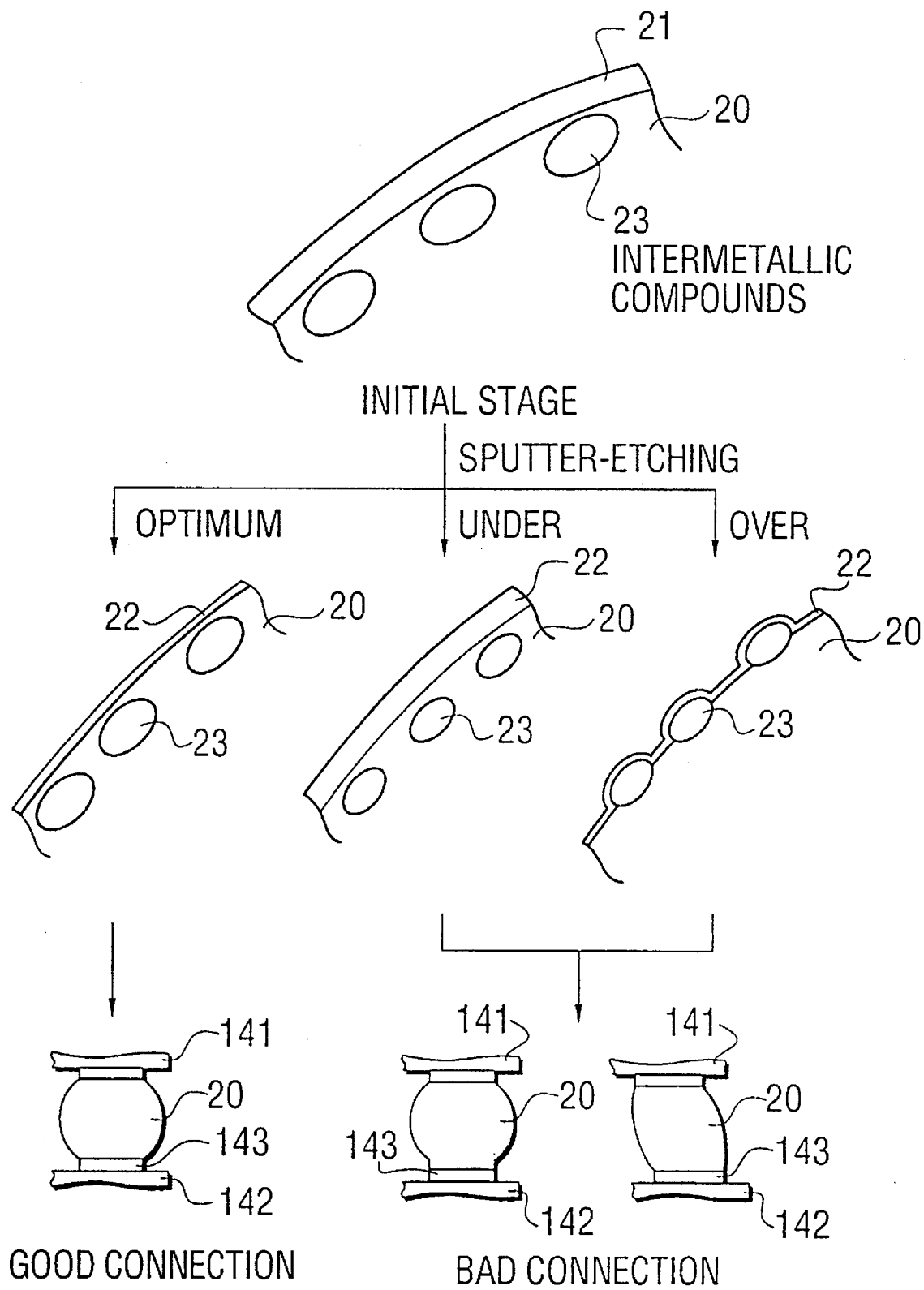
FIG. 5 is cross sectional views showing surface oxidation of solder ball and soldered state according to difference in sputter-etching condition.

FIG. 5 illustrates surface oxidation and connecting solder configuration, which depend upon sputter-etching condition.

When the sputter-cleaning is not performed for the oxide film of the solder surface or when the sputter-cleaning performed for the oxide film is under as shown in FIG. 4, fault connection such as insufficient formation of spherical segment of solder ball and insufficient self-alignment, etc., occurs due to thick oxide film.

Further, when intermetallic compounds 23 co-exist in a solder of such as Sn3Ag, similar fault connection may occur if over sputter-etching is performed. When over-sputter-etching is performed, surface of the soldering material becomes irregular since surfaces of intermetallic compounds 23 whose etching rate is lower than those surrounding the intermetallic compounds are exposed. Since oxidation proceeds along the irregular surface and melting rate of the intermetallic compounds is lowered due to reduced amount of solder structure around the intermetallic compounds, the intermetallic compounds 23 can not be melted sufficiently. As a result, rigidity of solder surface is increased and restoring force of molten solder material to the spherical segment configuration due to surface tension is reduced. Thus, there may be fault bonding configuration produced.

In order to obtain such good bonding configuration of solder as shown in FIG. 5, means is required for in-process-monitoring and controlling sputter-etching of solder ball to reliably remove oxide film thereon without over-etching.

Figure 6:
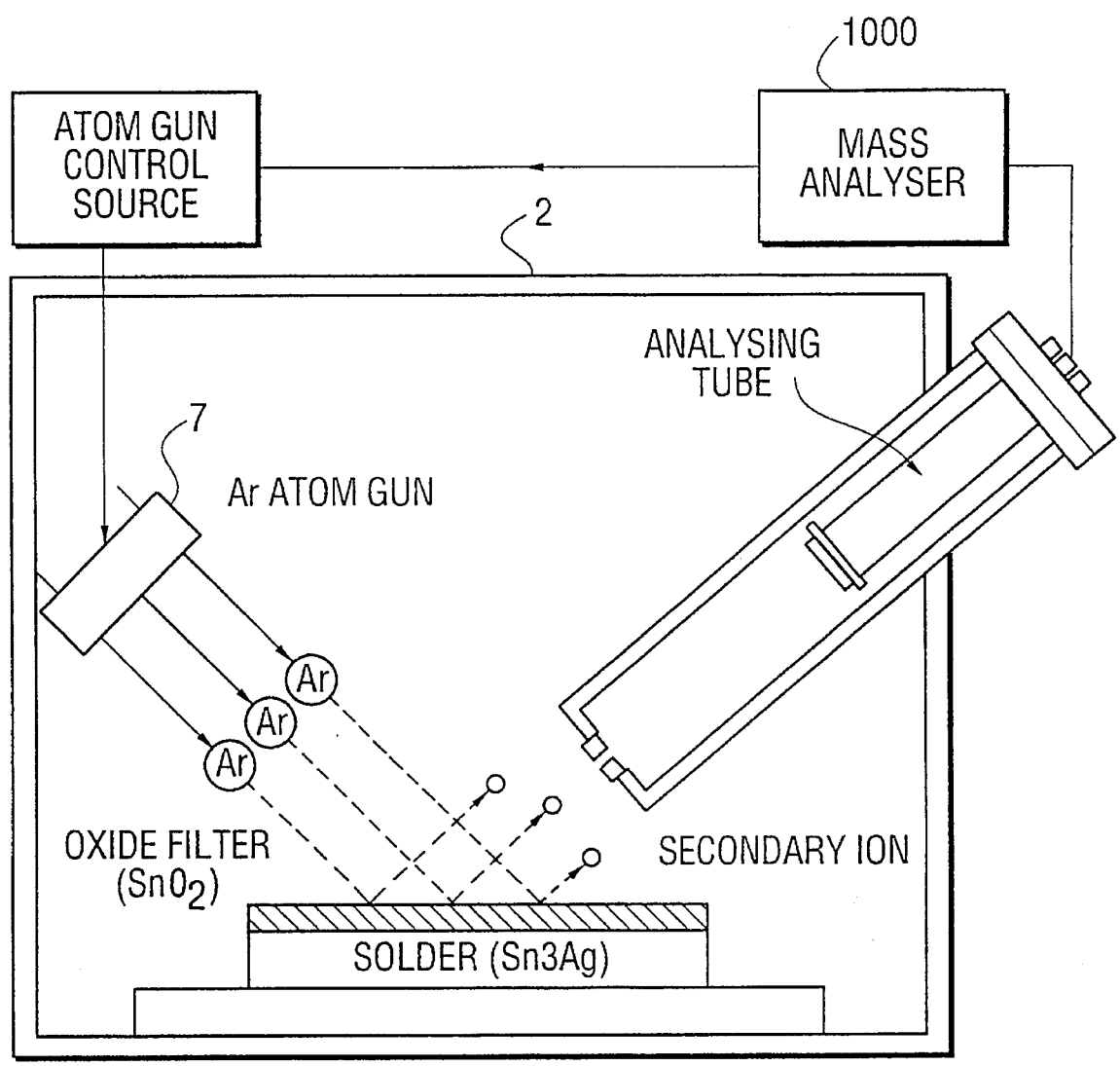
FIG. 6 is a block diagram showing a sputter-cleaning control means according to the present invention.

FIG. 6 is a block diagram of a sputter-cleaning control apparatus according to the present invention. As shown in FIG. 6, a sputter-etching in-process monitoring device 1000 having such device as quadrupole mass analyser for detecting secondary ion generated by sputter-etching and an analysing tube is associated with the sputter-cleaning chamber 2 shown in FIG. 1 to detect an end point of etching of oxide film.

FIG. 7 shows an example of monitored result of a surface oxide film on a solder, according to the present invention, which is obtained by performing an in-process monitoring of sputter-etching to detect secondary ion generated from a surface oxide film (SnO, $SnO_2$) on a Sn3Ag solder by sputter-etching. As shown in FIG. 7, an amount of secondary ion detected is large for a portion corresponding to oxide film and small for solder matrix portion. Therefore, it is possible to detect an end of sputter-etching of oxide film. That is, by controlling the sputter-etching such that it is terminated when the amount of secondary ion detected becomes an end level of oxide film or lower, it is possible to reliably remove the oxide film without over-etching.

With this scheme, it is possible to obtain a good bonding even for a solder in which intermetallic compound such as Sn3Ag co-exists.

Although, in the embodiment, secondary ion is detected, it is possible to perform the in-process monitoring and control of sputter-etching by detecting secondary electron, photon or neutral atom, etc., generated when oxide film is sputter-etched.

FIG. 8 illustrates steps of forming solder balls on bonding pads of an LSI and a substrate, etc.

Figure 8A:
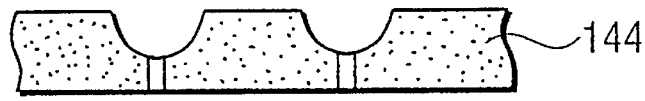
FIG. 8 shows steps of forming solder balls on a printed circuit board, according to the present invention.
Figure 8B:
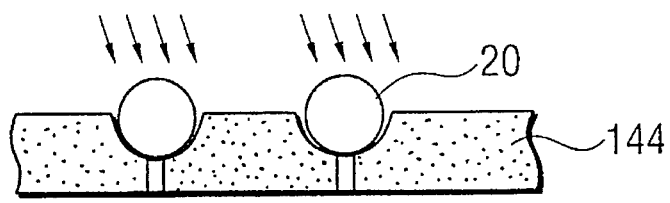

First, as shown in FIG. 8(a), a positioning plate 144 of such as glass fiber which has recesses at positions of respective solder balls 2 is prepared. A number of solder balls 2 are supplied onto the plate 144 and allowed to rotate, so that these solder balls 2 are received in the respective recesses as shown in FIG. 8(b). Then, these solder balls 20 in the recesses are irradiated with such as argon atom beam to remove oxide films thereon.

Figure 8C:
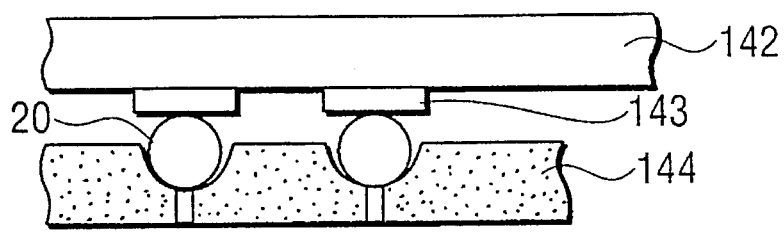
Figure 8D:
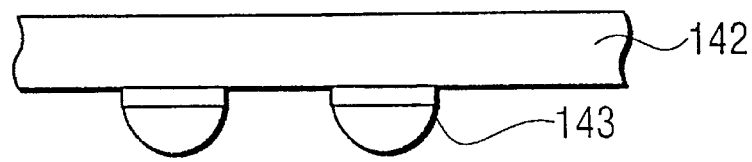

Then, as shown in FIG. 8(c), a printed circuit board 142 is put thereon with alignment between these solder balls and pads 143 of the circuit board 142 and, by heating them, the solder balls 20 are welded to the respective pads 143 as shown in FIG. 8(d).

Figure 9:
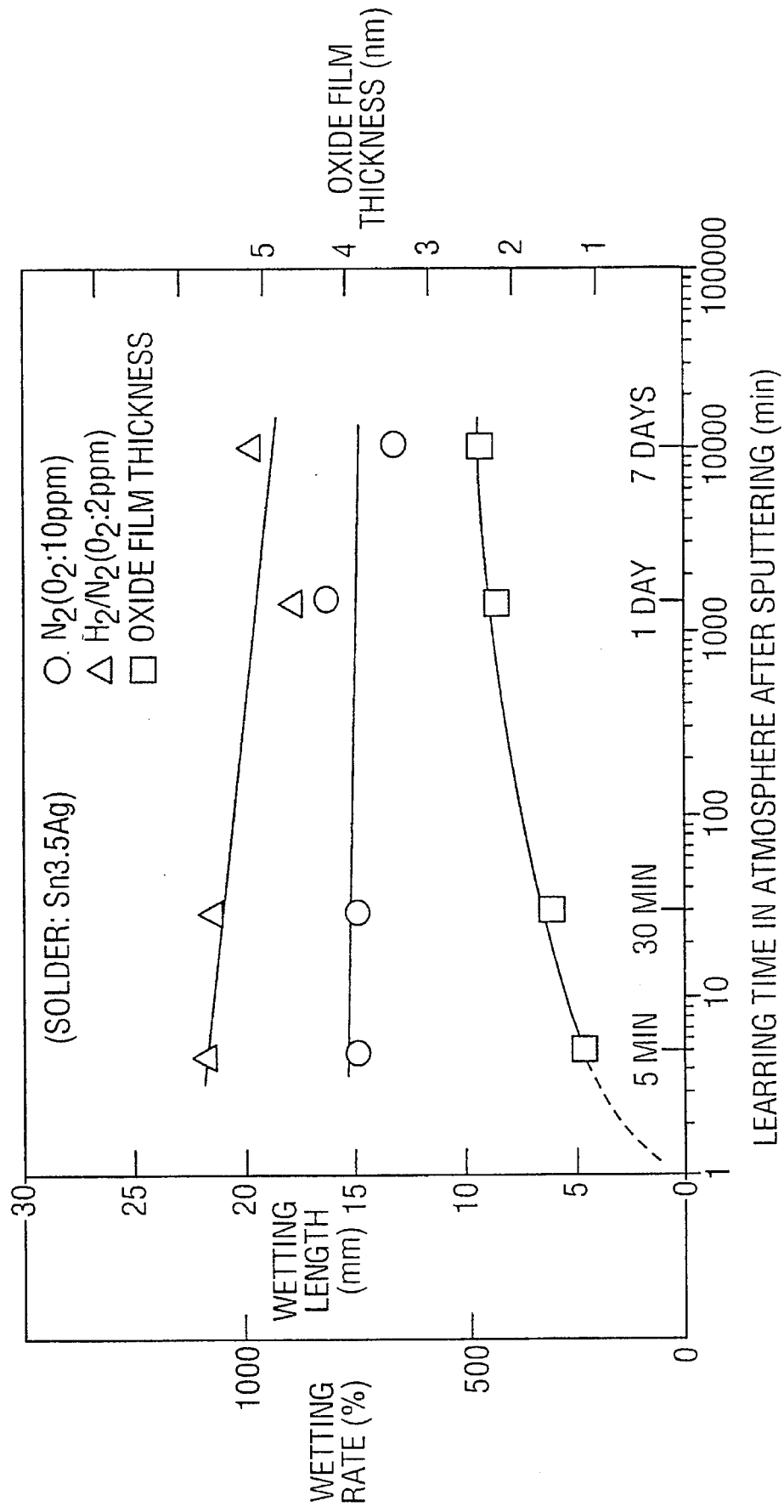
FIG. 9 shows thickness of oxide film on a surface of solder ball with time for which it is disposed in atmosphere and solderbility thereof.

FIG. 9 shows curves obtained by measuring a variation of thickness of oxide film 22 on the respective solder balls 20 atom-sputtered and left in atmospheric environment.

It is clear from FIG. 9 that, although thickness of oxide film becomes 1 nm after it is left for several minutes lapses in atmospheric environment, increase of thickness of oxide film for several days thereafter is limited in a range from 2 nm to 3 nm.

As mentioned with respect to FIG. 4, it is possible to perform the heating and melting process in the belt furnace in FIG. 1 so long as thickness of oxide film is 2 to 3 nm or smaller.

The curves in FIG. 9 marked by circular spots and triangle spots are wetting length and wetting rate of solder plotted for identical solder pellets which are heated and welded to pad surfaces similarly sputter-cleaned in the belt furnace 200 shown in FIG. 1 with using nitrogen gas or a mixture of hydrogen gas and nitrogen gas as the gas filling the furnace, respectively. As is clear from FIG. 9, although the wetting length and wetting rate characteristics are reduced slightly with time for which it is put in atmosphere, the wettability thereof is still acceptable even after exposition in atmosphere for 7 days and thus it is possible to obtain a good bonding without using flux.

Since it can be said from FIG. 9 that it takes much more time when the thickness becomes 5 nm which may be practical upper limit, there is no need of limiting the time for which the solder material can be put in atmospheric condition after sputter-cleaned.

Figure 10:
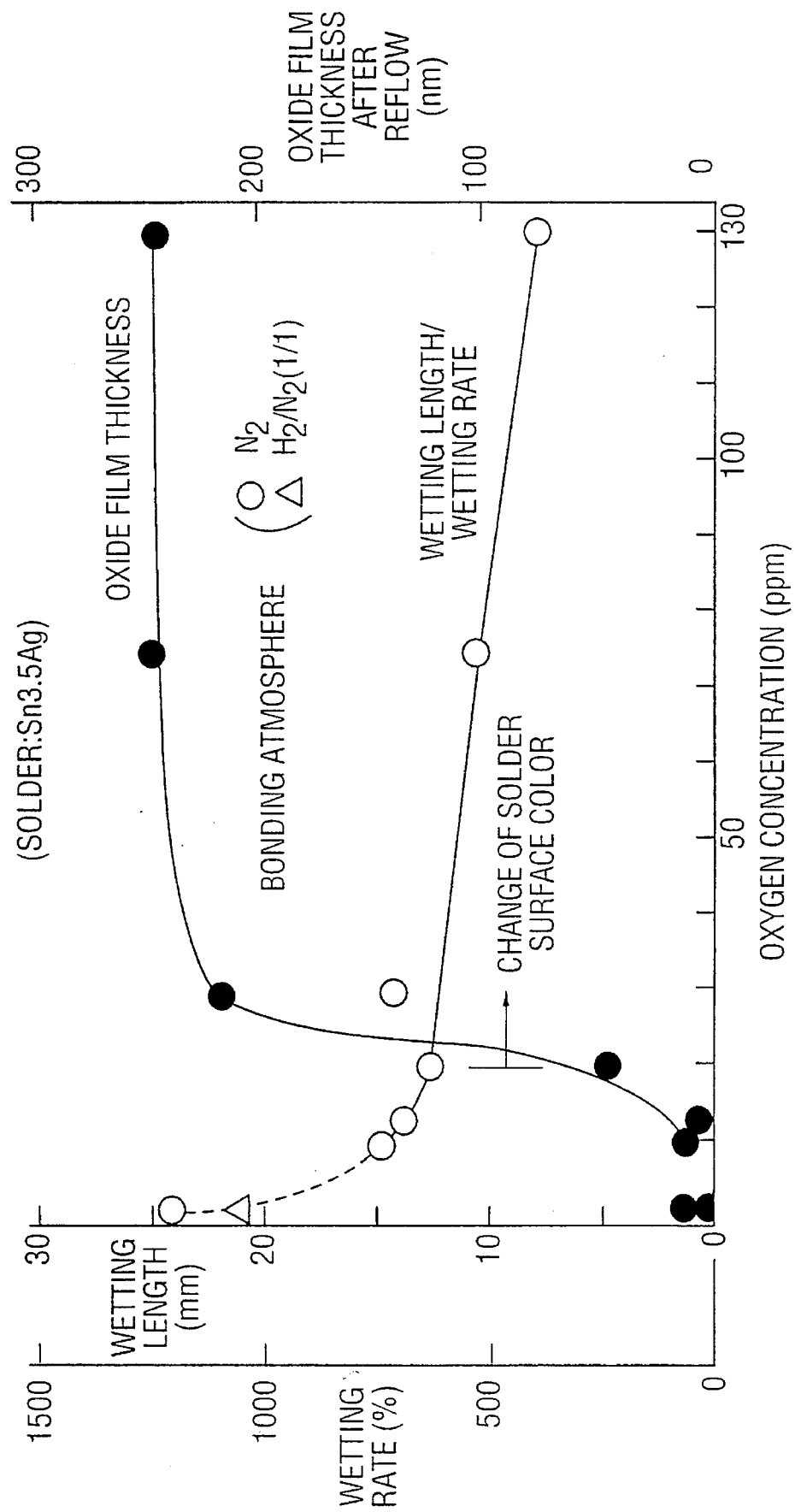
FIG. 10 shows thickness of oxide film on a surface of solder ball with oxygen concentration during heating and melting of solder ball.

FIG. 10 shows plots of the thickness of oxide film on the solder ball of Sn3.5Ag and the wetting rate and the wetting length thereof when soldered in the belt furnace 200 with respect to oxygen concentration in the furnace.

When oxygen concentration exceeds 20 ppm, the oxide film thickness increases abruptly beyond 200 nm. Further, the wetting rate and wetting length are reduced remarkably until oxygen concentration reaches 20 ppm. Beyond 20 ppm, solder surface changed in color to light violet and became useless practically.

Figure 11:
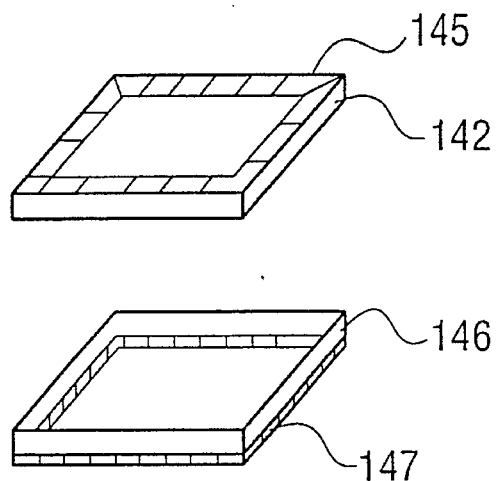
FIG. 11 is a perspective view of a substrate and its roof.

Now an embodiment of the present invention will be described with reference to FIG. 11, in which a roof plate 147 having a frame 146 is bonded to a substrate 142 having metallized portion 145.

Figure 12:
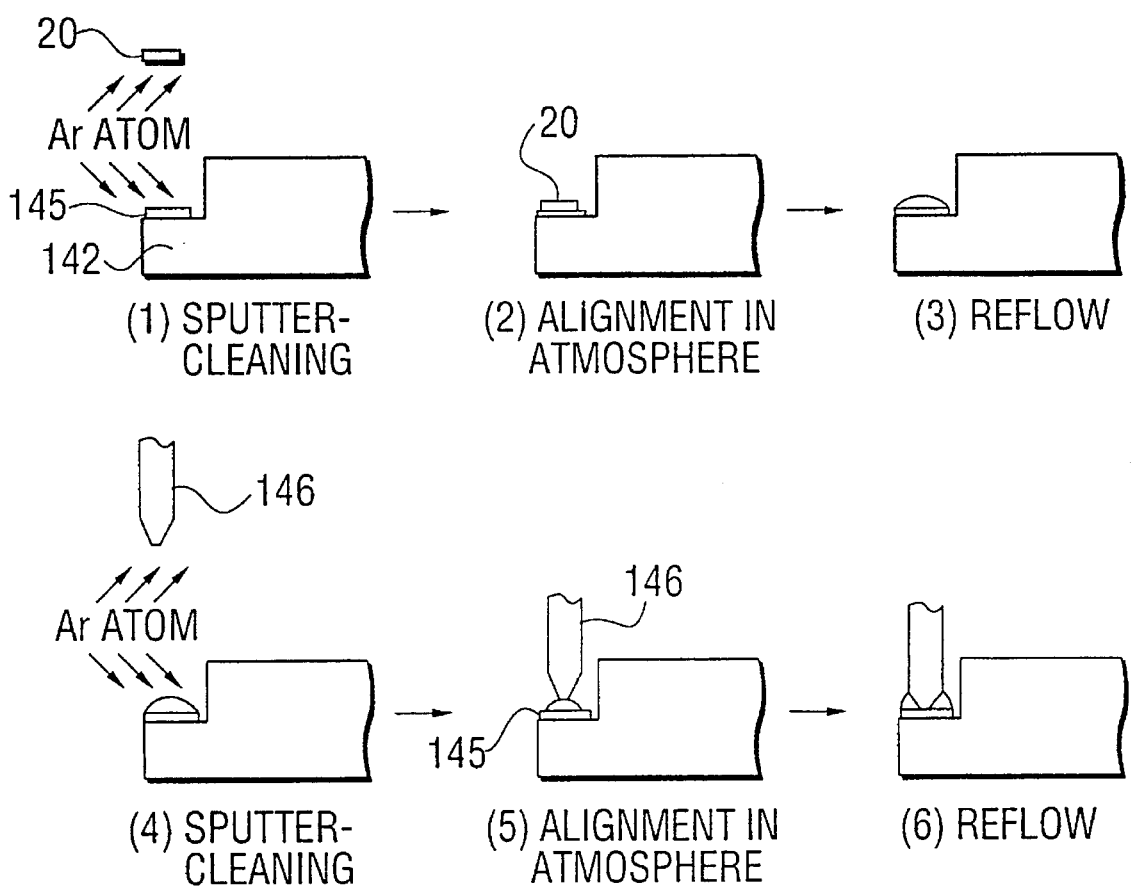
FIG. 12 shows steps of soldering the roof to the substrate, according to the present invention.

As shown by (1) in FIG. 12, the metallized portion 145 and a solder 20 are sputtered with Ar atom and the solder 20 whose oxide film is thus removed is put on the metallized portion 145 as shown by (2) in FIG. 12. Then, as shown by (3) in FIG. 12, the solder 20 is melted in non-oxidizing atmosphere to form a solder ball by reflow.

Thereafter, the frame 146 and the solder ball on the metallized portion 145 are atom or ion-sputtered again as shown by (4) in FIG. 12, the frame 146 is aligned with the metallized portion 145 in atmospheric environment as shown by (5) in FIG. 12 and then they are soldered in non-oxidizing atmosphere as shown by (6) in FIG. 12.

In the present invention in which oxide film and/or contamination film on the surfaces of the solder on the members to be bonded and the pads is sputter-cleaned and then alignment is performed in atmosphere, there is no need of providing any aligning device in vacuum environment. Since, therefore, the heat and melt bonding can be done without using a universal belt furnace, the workability and producibility, etc., can be improved considerably.

Further, since the sputter-etching can be monitored and controlled in process, it is possible to reliably remove the oxide film and/or contamination film while preventing over-etching and to perform a good bonding without degrading restoring force of the solder due to surface tension.

Further, since the oxide film and/or contamination film on the solder surface and the pad surface can be removed mechanically, the sputter-cleaning device may be omitted or the number of sputter-cleaning steps may be reduced, resulting in improved efficiency of bonding process.

In addition, it is possible to set the solder bonding condition optimum by controlling concentration of non-oxidizing or reducing gas in the heat and melt device.

Finally, it is possible to improve an operational efficiency of electronic circuit connecting device by transporting the members to be bonded by a belt conveyor.

While the present invention has been particularly shown and described with reference to the preferred embodiments thereof, it will be understood by those skilled in the art that the foregoing and other modifications in form and details may be made therein without departing from the spirit and scope of the present invention.

What is claimed is:

1. A method of soldering for use in fabricating an electronic circuit device, comprising the steps of:

removing an oxide layer from a surface of a soldering material by sputter-etching of the soldering material with atom or ion, said removing including detecting substance emitted from the soldering material, determining whether the detected substance is from the oxide layer on the soldering material or from the soldering material and controlling the sputter-etching according to the determination;

aligning members to be bonded by the soldering material in an oxidizing atmosphere; and heating said soldering material and performing a soldering operation in non-oxidizing atmosphere.

2. The method claimed in claim 1, wherein the substance emitted is at least one substance selected from a group consisting of secondary atom, secondary ion, photon and secondary electron.

3. The method claimed in claim 1, wherein the detecting includes a step of detecting at least one substance selected from a group consisting of secondary atom, secondary ion, photon and secondary electron.

4. The method claimed in claim 1, wherein said soldering material is at least one material selected from a group consisting of alloys of Pb and Sn, alloys of Sn and Ag, alloys of Au and Sn, alloys of Au and Ge and alloys of Au and Si or any combinations of these alloys.

5. The method claimed in claim 1, wherein said non-oxidizing atmosphere is inert gas.

6. The method claimed in claim 1, wherein said non-oxidizing atmosphere is reducing gas.

7. The method claimed in claim 1, wherein said non-oxidizing atmosphere is fluorocarbon vapor.

8. The method claimed in claim 5, wherein the inert gas is nitrogen gas.

9. The method claimed in claim 5, wherein the inert gas is argon gas.

10. The method claimed in claim 5, wherein the inert gas is helium gas.

11. The method claimed in claim 1, wherein said non-oxidizing atmosphere is a reducing gas atmosphere.

12. The method claimed in claim 11, wherein the reducing gas atmosphere is one gas selected from hydrogen gas and a mixture of hydrogen gas and nitrogen gas.

13. A soldering apparatus for use in fabricating an electronic circuit device, comprising:

means for removing an oxide layer from a surface of a soldering material by sputter-etching of the soldering material with atom or ion, said means for removing including detecting a substance emitted from the soldering material, determining whether the detected substance is from the oxide layer on the soldering material or from the soldering material and controlling the sputter-etching according to the determination;

aligning means for aligning members to be bonded by the soldering material in an oxidizing atmosphere; and heating means for heating said soldering material and performing a soldering operation in non-oxidizing atmosphere.

14. The apparatus claimed in claim 13, further comprising evacuating means for evacuating an interior of said heating means and means for supplying non-oxidizing gas into said interior of said heating means.

15. The apparatus claimed in claim 14, wherein said non-oxidizing gas is selected from a group consisting of nitrogen gas, argon gas, helium gas and any mixture of them, and a mixture of hydrogen gas and nitrogen gas, and further comprising controlling means for controlling concentration of said non-oxidizing gas in said interior of said heating means to control concentration of impurity gas content of said non-oxidizing gas according to degree of vacuum attained by said evacuating means and the concentration of said non-oxidizing gas.

16. The apparatus claimed in claim 13, wherein said heating means includes a plenum chamber having an evacuating system and a gas introducing system, a heating and melting chamber having a belt furnace for heating and melting solder material on said connecting members to be bonded and a cooling chamber for cooling said electronic circuit members, a gate valve for allowing said plenum chamber to be opened to atmosphere, a gate valve provided between said plenum chamber and said heating and melting chamber, a gate valve provided between said heating and melting chamber and said cooling chamber and a gate valve for allowing said cooling chamber to be opened to atmosphere.

17. The apparatus claimed in claim 13, wherein the substance emitted is at least one substance selected from a group consisting of secondary atom, secondary ion, photon and secondary electron.

18. The apparatus claimed in claim 13, wherein said removing means detects at least one substance selected from a group consisting of secondary atom, secondary ion, photon and secondary electron.

19. The apparatus claimed in claim 13, wherein said soldering material is at least one material selected from a group consisting of alloys of Pb and Sn, alloys of Sn and Ag, alloys of Au and Sn, alloys of Au and Ge and alloys of Au and Si or any combinations of these alloys.

20. The apparatus claimed in claim 13, wherein said non-oxidizing atmosphere is inert gas.

21. The apparatus claimed in claim 13, wherein said non-oxidizing atmosphere is reducing gas.

22. The apparatus claimed in claim 13, wherein said non-oxidizing atmosphere is fluorocarbon vapor.

23. The apparatus claimed in claim 20, wherein the inert gas is nitrogen gas.

24. The apparatus claimed in claim 20, wherein the inert gas is argon gas.

25. The apparatus claimed in claim 20, wherein the inert gas is helium gas.

26. The apparatus claimed in claim 13, wherein said non-oxidizing atmosphere is a reducing gas atmosphere.

27. The apparatus claimed in claim 26, wherein the reducing gas atmosphere is one gas selected from hydrogen gas and a mixture of hydrogen gas and nitrogen gas.

* * * * *